United States Patent [19]

Kister et al.

[11] Patent Number: 5,742,174
[45] Date of Patent: Apr. 21, 1998

[54] MEMBRANE FOR HOLDING A PROBE TIP IN PROPER LOCATION

[75] Inventors: January Kister, Menlo Park; Jerzy Lobacz, San Mateo, both of Calif.

[73] Assignee: Probe Technology, Santa Clara, Calif.

[21] Appl. No.: 553,069

[22] Filed: Nov. 3, 1995

[51] Int. Cl.$^6$ .................................................. G01R 31/02
[52] U.S. Cl. .............................................. 324/762; 324/754
[58] Field of Search ............................ 324/754, 73.1, 324/72.5, 762, 761, 158.1, 765; 439/482, 824

[56] References Cited

U.S. PATENT DOCUMENTS

| | | | |
|---|---|---|---|
| 3,445,770 | 5/1969 | Harmon | 324/754 |
| 4,523,144 | 6/1985 | Okubo et al. | 324/72.5 |
| 4,922,192 | 5/1990 | Gross et al. | 324/72.5 |
| 5,012,187 | 4/1991 | Littlebury | 324/72.5 |
| 5,055,778 | 10/1991 | Okubo et al. | 324/72.5 |
| 5,180,977 | 1/1993 | Huff | 324/754 |
| 5,355,079 | 10/1994 | Evans et al. | 324/754 |
| 5,389,885 | 2/1995 | Swart | 324/761 |
| 5,422,574 | 6/1995 | Kister | 324/754 |

*Primary Examiner*—Vinh P. Nguyen

*Attorney, Agent, or Firm*—Lumen Intellectual Property Services

[57] ABSTRACT

A method and device for accurately mounting a probe in a probe card and for maintaining correct location of the probe tip as the probe is used for electronic testing of an IC pad. A membrane having a slot is attached to a support structure of a probe card. The probe tip is inserted into the slot and the probe is affixed to the membrane at the edges of the slot using silicon rubber. The probe is then mounted in the support structure which has a groove for receiving the probe. A distal end of the probe is bonded to the walls of the groove so that the probe is free to move vertically in the groove, but constrained from moving laterally to prevent side-buckling. The membrane and silicon rubber hold the probe tip in proper location during thermal treating of the probe card assembly. Once mounted in the probe card by this method, the probe and probe tip will maintain proper location as they are used for electronic testing of an IC pad. During testing, the probe tip and attached membrane are deflected from their initial position by force of contact with the IC pad. Upon completion of the test, the contact force is removed from the probe tip. The elasticity of the membrane causes the membrane and the attached probe tip to return to their initial position, ensuring that the probe tip is in the proper location for the next test.

20 Claims, 4 Drawing Sheets

MEMBRANE FOR HOLDING A PROBE TIP IN PROPER LOCATION

BACKGROUND

1. Field of the Invention

The present invention relates generally to contact probes for testing electrical circuitry, and in particular to a method and device for accurately positioning the tips of contact probes.

2. Description of Prior Art

Probe cards or testing devices are crucial for efficient manufacture of electronic circuits. These devices enable one to test and isolate defective circuits during production. Probe cards are frequently employed for functional testing of integrated circuits on wafers before cutting and mounting these integrated circuits inside an IC chip package. The arbitrary positions and enormous number of contact pads in such circuits, especially in the very large scale integration domain, impose stringent requirements on probe cards.

To meet these stringent requirements, the probe card's contacting elements, probe needles or probes, must be maintained in precise alignment during both the construction and operation of the probe card. In operation, the probe is repetitively driven against the pads under test. The distance by which the probes are moved towards the pads is commonly called overdrive. When driven against the pad the probe undergoes a deflection and its tip executes a lateral movement. The lateral scrubbing of the tip helps to remove an insulating oxide layer formed on the surface of the pad. This ensures proper electrical contact between the probe and the pad. Otherwise, the contact resistance between the probe and the pad would prevent the passage of electrical signals necessary for testing.

The repetitive nature of the testing process, geometrical unevenness of wafers, and abrasion and fatigue of probe tips all affect the long-term probe performance. In particular, these factors affect the alignment or planarity of the probe tips and prevent the establishment of proper electrical contact between the probes and the corresponding pads. Large variance in planarity can not be overcome by increasing the overdrive since this would damage or even destroy the probes.

Because of these strict operational requirements, the probes must be mounted and affixed to the probe card with a high degree of precision and accuracy. The probe tips of a completed probe card must be located properly if they are to perform the ensuing tests accurately. Mounting and affixing the probes to a probe card presents two problems. First, in mounting the probe, the relatively small size of the probe tip makes it difficult to hold the probe tip in its proper location while affixing the probe's distal end to the probe card. Epoxy is the usual bonding material applied to the distal end to attach the probe to the probe card.

Secondly, the bonding material must be thermally treated to bond adequately with the probe, a process called epoxy curing. During this epoxy curing, the epoxy changes shape slightly, thus moving the probe, and particularly the probe tip, out of its proper location. Attempts at moving the probe tip back to its proper location, commonly called tweaking, are not entirely successful. The probe tip will tend to move back to the same location that it occupied immediately after epoxy curing, an occurrence commonly called spring back. Thus there is a need to mount and affix probes in a manner ensuring that the probe tip will be in proper location after both the mounting and thermal treating steps have been completed.

Attempts have been made at solving these problems by suitable probe mounting and design. For example, U.S. Pat. No. 5,334,931 issued to Clarke et. al. on Aug. 2, 1994 discloses a probe formed from a molded plastic and equipped with a conductive contact tip. The body of the probe is cantilevered and designed such that the contact tip scrubs the surface of the pad of a device under test when overdrive is applied. Although this construction makes replacement of the conductive contact tip simple, the probe mounting arrangement is complicated, and planarity of the probe tips can not be ensured after many testing cycles.

U.S. Pat. No. 5,280,236 issued to Takahashi et al. on Jan. 18, 1994 discloses a probe made of a cobalt-based alloy containing at least 10% chromium by weight. The probe has a solder-enhanced metallic layer on its tip. These provisions ensure good scrubbing action due to the metallic coating on the tip and probe longevity due to the elasticity of the probe itself. Nonetheless, the application of repetitive stress disturbs probe planarity and deforms the probes. Moreover, no attempt is made to address the problems of mounting and affixing the probe to the probe card in a manner that will ensure proper probe tip location.

Finally, U.S. Pat. No. 4,980,638 issued to Dermon et al. on Dec. 25, 1990 discloses a probe of controlled shape and dimensions. The shaft portion of each probe is tapered for easy replacement of the probes. The probes are etched out of a sheet. However there are no provisions to ensure correct placement of the probe tips during probe mounting and during operation of the probe.

Thus, none of the above-mentioned prior art probe arrangements overcome the problem of mounting and affixing probes to a probe card in a manner that will ensure proper location of the probe tips. They also lack a method or device for ensuring accurate positioning of the probe tips during the operation of the probes.

OBJECTS AND ADVANTAGES OF THE INVENTION

In view of the above, it is an object of the present invention to provide a method and device for accurately positioning a probe tip when mounting a probe onto a probe card.

Another object of the invention is to provide a method and device for keeping the probe and probe tip in proper location during thermal treatment of the mounted probe.

Yet another object of the invention is to provide a method and device for keeping the probe tip in proper location and alignment during operation of the probe.

These and other objects and advantages will become more apparent after consideration of the ensuing description and the accompanying drawings.

SUMMARY OF THE INVENTION

In accordance with the objects of the invention, the accurate positioning of the probes is accomplished through a suitable design of the probe card. In particular, the invention presents a method and device for mounting and using a cantilever probe which keeps the probe in the correct location during both the mounting and testing operations. The cantilever probe has a probe arm, a probe tip, and a distal end opposite the probe tip.

According to the method, a membrane is stretched horizontally across the open center of a probe card's support structure. Next, the outer edges of the membrane are attached to the bottom surface of the support structure using a suitable bonding material, preferably an epoxy. The membrane is made of a sufficiently elastic material to ensure that the membrane deflects vertically when a force is applied to its center and returns to its flat horizontal alignment when the force is removed. The membrane is made of a polyimide in the preferred embodiment. Ceramic is the preferred membrane material for high temperature applications.

Next, a membrane slot is cut into the membrane. The probe tip is then inserted into the membrane slot and the probe is affixed to the membrane at the edges of the membrane slot. In a preferred embodiment, the probe is affixed to the membrane with silicon rubber and the silicon rubber is applied at a knee section of the probe.

The distal end of the probe is then mounted in the support structure such that the probe arm is free to move vertically and constrained from moving laterally to prevent side-buckling. In the preferred embodiment, the support structure has a groove for receiving the probe. The probe is mounted inside the groove by its distal end either by bonding or soldering to the wall of the groove. Once the probe has been mounted according to this method, the probe card assembly can be thermally treated without the probe tip moving from its proper location. The silicon rubber and membrane hold the probe tip in its proper location throughout the thermal treatment.

The electronic testing device produced in accordance with the method of the invention ensures proper location of the probe tip as it is used to test circuits. When the testing device is mounted on a test wafer having an IC pad to be tested, the probe tips are located directly above the IC pad. An overdrive applied to the probe tip causes the deflection of the probe tip necessary for lateral scrubbing of the IC pad and proper electrical contact.

This deflection causes the probe tip, membrane, and probe arm to move from their initial position to a deflected position. When the overdrive is removed upon completion of the test, the elasticity of the membrane causes the membrane to move back to its initial horizontal position. Because the probe is attached to the membrane, the membrane also carries the probe tip and probe arm back to the same initial position they occupied before the overdrive was applied. The membrane ensures proper location of the probe tip for the next test. A better understanding and appreciation of the invention will be gained upon reading the detailed description referring to the attached figures.

DESCRIPTION

Figure 3:
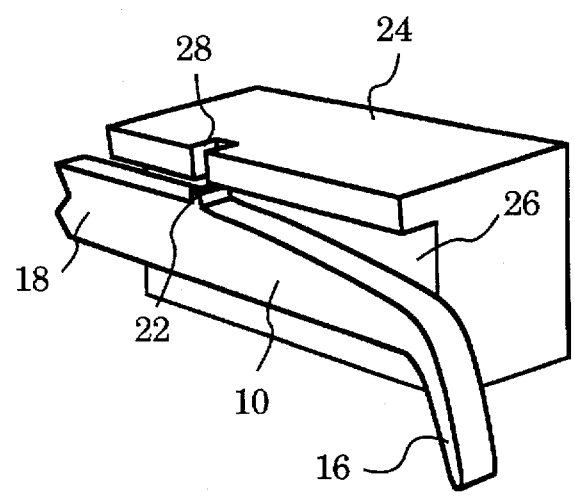
FIG. 3 is a sectional perspective view of a probe located in a support structure.
Figure 4:
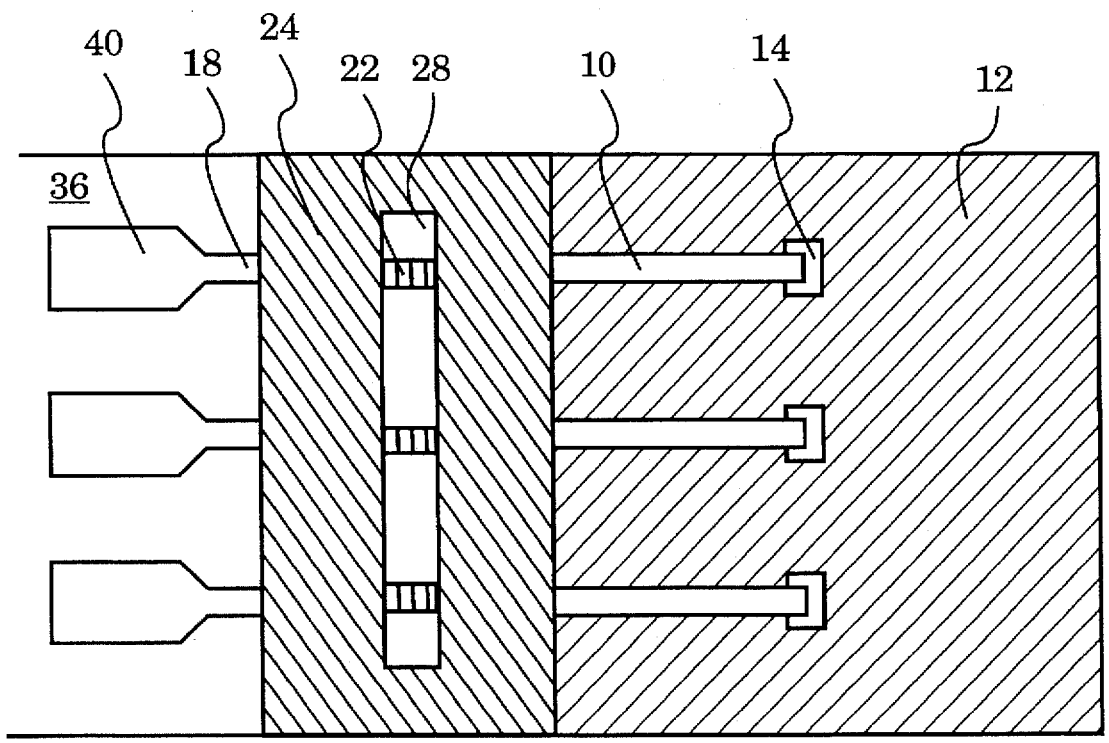
FIG. 4 is a top view of probes mounted in a positioning device according to the invention.
Figure 5:
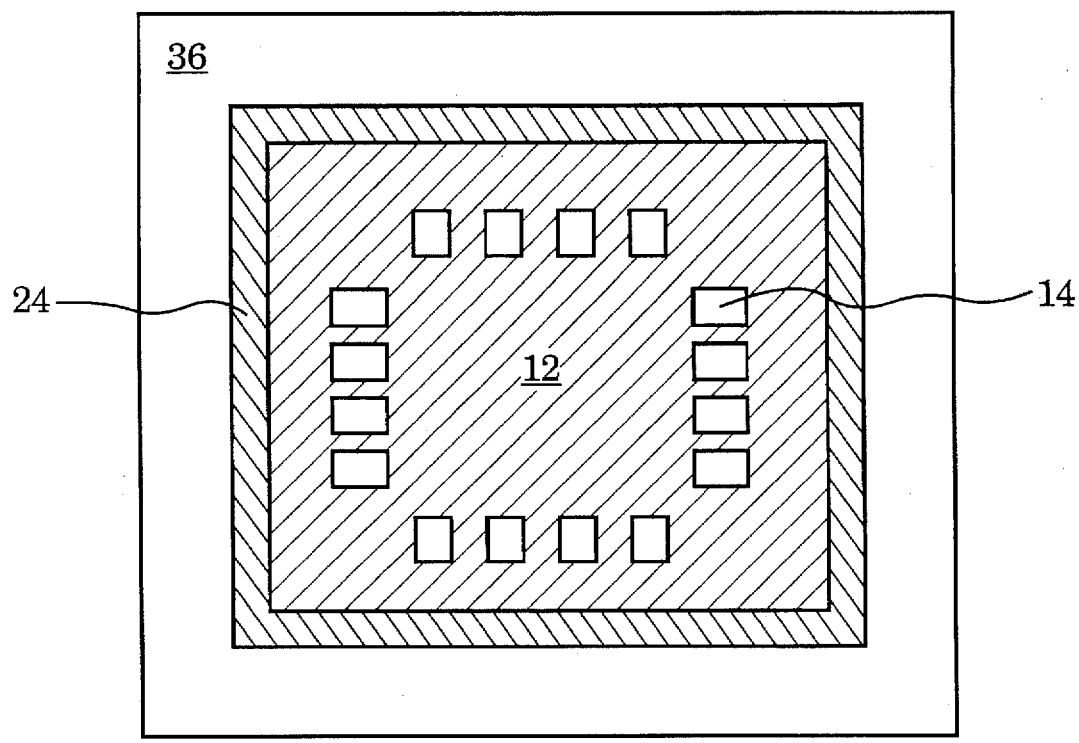
FIG. 5 is a top view of the probe positioning device according to the invention.

The preferred embodiment of the invention is shown in FIG. 1–FIG. 6. Referring to FIG. 5, a support structure 24 is a rectangular ring having open space in its center. Structure 24 is preferably made of a ceramic material. A membrane 12 has sufficient length and width to cover the open center space of structure 24. Membrane 12 is stretched tightly across this open center space in a horizontal plane and attached to the bottom surface of structure 24. In the preferred embodiment, membrane 12 is attached to structure 24 using an epoxy, although other methods of attachment are possible.

Figure 1:
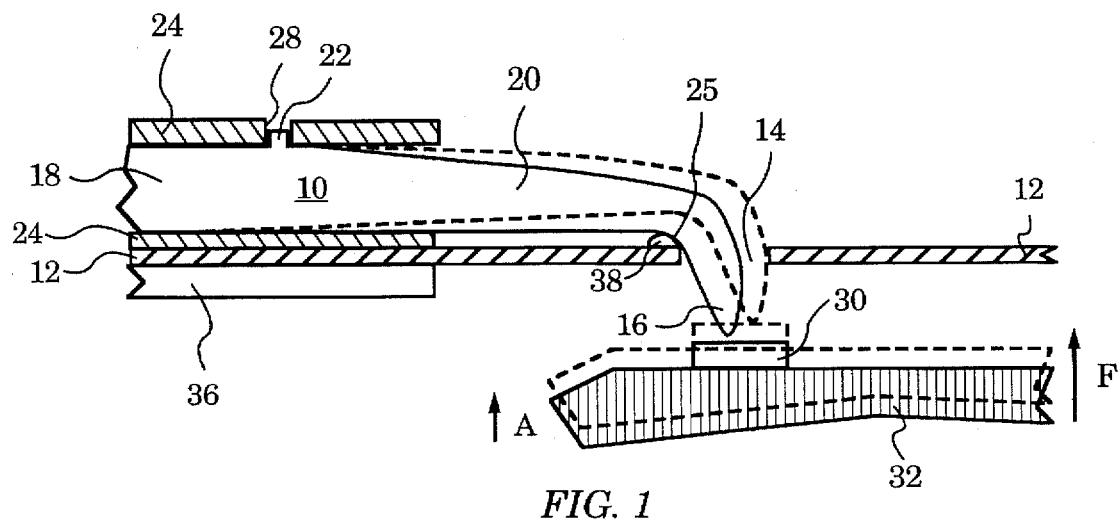
FIG. 1 is a side view of a probe positioning device according to the invention.
Figure 2:
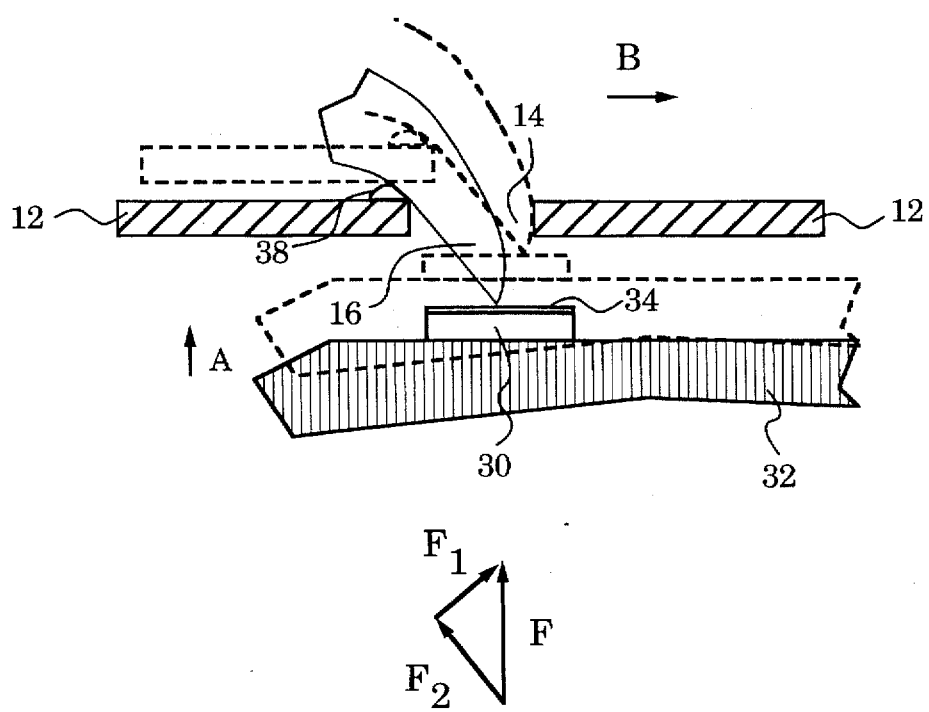
FIG. 2 is a side view of the probe tip of FIG. 1 undergoing deflection.

Membrane 12 is sufficiently rigid to maintain its horizontal alignment when no force is applied to its center portion, as shown in FIG. 1. However, membrane 12 is also sufficiently elastic to deflect vertically at least 3 mils when a force is applied to its center portion, as shown in FIG. 2. The elasticity of membrane 12 also ensures that it returns to its horizontal alignment when the force is removed. In the preferred embodiment, membrane 12 is made of a polyimide and its thickness ranges from 10 to 50 micrometers, with a preferred value of 25 micrometers. In another embodiment, membrane 12 is made of a ceramic material for high temperature applications.

Figure 6:
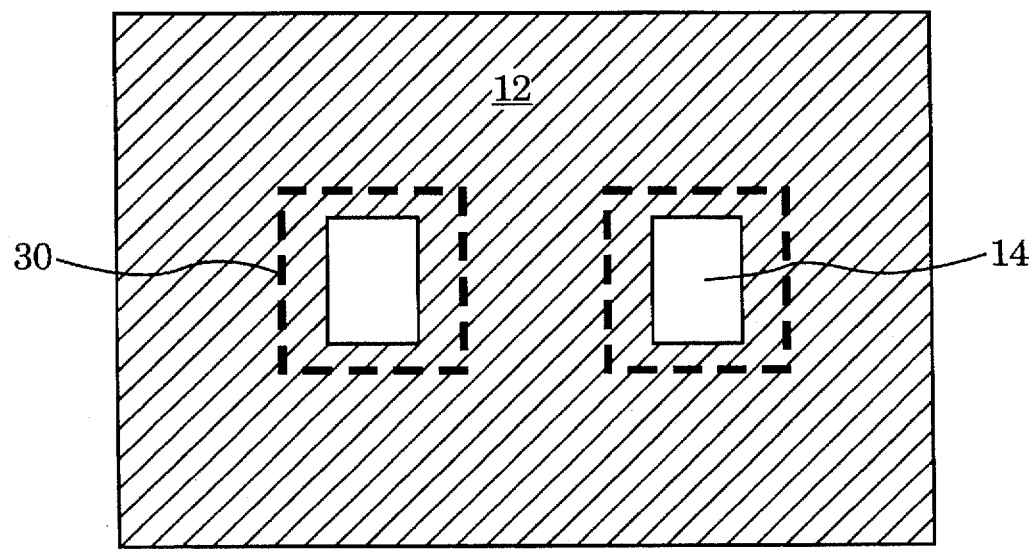
FIG. 6 is a top view of the membrane, slots, and pads according to the invention.

Next, a slot 14 is cut into membrane 12, as shown in FIG. 1. Slot 14 has sufficient dimensions to allow a tip 16 of a cantilever probe 10 to be inserted into slot 14. In the preferred embodiment, slot 14 has a width of 1.1 mils to accommodate tip 16 of width 1.0 mils. Slot 14 has a length sufficient to allow free horizontal deflection of tip 16. Slot 14 is located in membrane 12 such that the center of slot 14 is positioned directly above the center of a pad 30 when a test wafer 32 holding pad 30 is placed under structure 24, as illustrated in FIG. 1 and FIG. 6.

Referring again to FIG. 1, probe 10 is inserted into slot 14 so that knee section 25 contacts an edge of slot 14. Knee section 25 is then attached to membrane 12 by a material 38. Material 38 has sufficient adhesive strength to hold tip 16 in proper location during thermal treating of the probe card assembly and during the operational testing of IC pads. Additionally, material 38 has sufficient adhesive strength to secure probe 10 against side buckling during deflection of tip 16. In the preferred embodiment, material 38 is silicon rubber.

Referring to FIG. 3, probe 10 is next mounted in a groove 26 of structure 24. Groove 26 can be easily machined by an excimer laser. The width and depth of groove 26 are sufficient to accommodate probe 10. In this embodiment, the width of groove 26 is 1.1 mils and its depth is 5 mils. Structure 24 has a slot 28 for receiving locating tab 22. Distal end 18 of probe 10 can be better aligned by using locating tab 22. In a preferred method of locating probe 10 in groove 26 a vacuum is applied through slot 28. Locating tab 22 is drawn into slot 28 and causes probe 10 to align itself properly inside groove 26.

Probe 10 is bonded to the walls of groove 26 once properly aligned. This is preferably done by soldering or adhesive bonding of the sides of distal end 18 to the walls of groove 26. Specific bonding techniques are well-known in the art. With distal end 18 attached to the walls of groove 26, arm 20 can move freely up and down over a range of at least three mils. Also, arm 20 is secured against side-buckling by the walls of groove 26.

Once probe 10 has been mounted in structure 24, the entire assembly is thermally treated to cure the epoxy. During this thermal treatment, the epoxy attaching distal end 18 to the walls of groove 26 will change shape. However, this epoxy curing does not move tip 16 from its proper location. Material 38 and membrane 12 hold tip 16 firmly in place throughout the thermal treatment, so that tip 16 is properly located upon completion of the epoxy curing stage.

Referring again to FIG. 5, a circuit board 36 has a rectangular shape with an open center space of the same size and shape as the open center space of structure 24. Upon completion of the thermal treatment, structure 24 is attached to the top surface of circuit board 36 such that their open center spaces are aligned.

FIG. 4 illustrates a top view of three probes 10 mounted for carrying out an actual test. Probes 10 are inserted into slots 14 and attached to membrane 12 at edges of slots 14.

Locating tabs 22 are inserted into slots 28. The sides of distal ends 18 are attached to structure 24. Distal ends 18 are also attached to circuit board 36 by solder junctions 40.

The operation of probe 10 is clarified in FIGS. 1 and 2. In particular, FIG. 2 shows how probe 10 reacts to an overdrive urging tip 16 against pad 30 on test wafer 32. Initially, tip 16 hovers over pad 30 as indicated by the solid outline. An overdrive is applied in the direction of arrow A. This is done by either lowering structure 24 or raising wafer 32 according to well-known testing methods.

The overdrive distance typically ranges between 3 and 6 mils. At first, tip 16 approaches pad 30 and establishes contact with it. Further overdrive creates a test force F on tip 16 and causes arm 20, tip 16, and membrane 12 to be deflected as illustrated by the dotted outline. A desirable vertical deflection is 3 mils. In addition to deflecting tip 16, arm 20, and membrane 12 vertically, the $F_1$ component of force F causes tip 16 to perform a horizontal scrubbing movement, as shown in FIG. 2. This movement occurs in the direction of arrow B and is typically very short, 1 mil or less. Nonetheless, scrubbing is very important in the testing process because it removes an oxide layer 34 and any impurities (not shown) accumulated on top of pad 32. A good electrical contact between tip 16 and pad 32 is thus guaranteed.

Once good electrical contact between tip 16 and pad 32 has been established, electrical testing of pad 30 commences. After this testing is completed, test wafer 32 is lowered, removing the overdrive from tip 16. Once the overdrive is removed, the elasticity of membrane 12 causes it to move from its deflected position back to its flat horizontal position. Because membrane 12 is attached to probe 10 at knee section 25, membrane 12 carries tip 16 and arm 20 back to the same location they occupied before the overdrive was applied. Membrane 12 thus ensures that tip 16 is in proper location for the next testing cycle.

Figure 7:
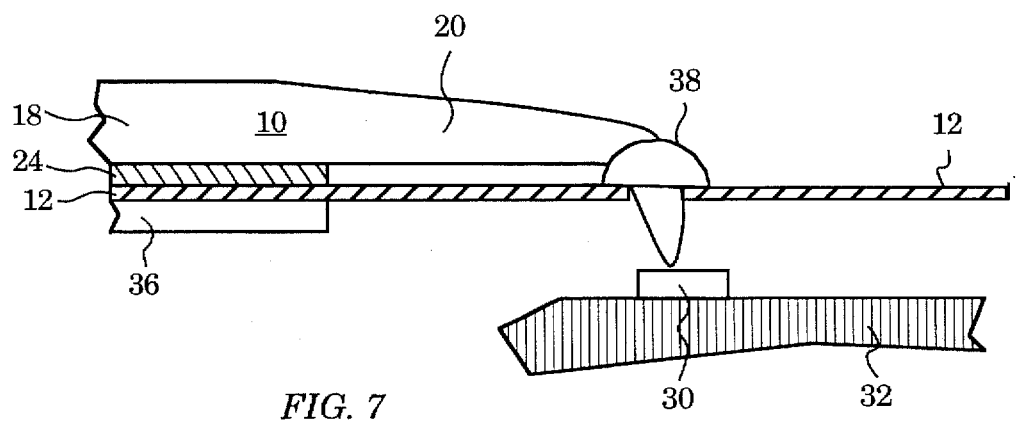
FIG. 7 is a side view of another probe positioning device according to the invention.

FIG. 7 illustrates a second embodiment of the invention. Structure 24 has a flat top surface for supporting probe 10. Probe 10 is attached to this flat top surface of structure 24 by a part of distal end 18, such that arm 20 is free to move vertically, but constrained from moving laterally. Distal end 18 is attached to structure 24 by a suitable bonding material, preferably epoxy. Additionally, probe 10 is now attached to membrane 12 by adhesive material 38 around the entire perimeter of membrane slot 14.

The operation of the second embodiment differs from the operation of the first embodiment in the deflection of membrane 12. When an overdrive is applied to tip 16, it produces a deflection of tip 16, arm 20, and membrane 12. Since probe 10 is attached to membrane 12 around the perimeter of membrane slot 14, membrane 12 is deflected on all sides of membrane slot 14. Otherwise, the operation and advantages of this embodiment are the same as those disclosed for the preferred embodiment above.

Figure 8:
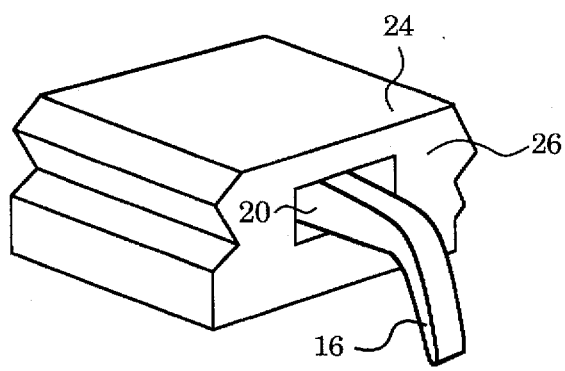
FIG. 8 is a perspective view of a probe mounted in a support structure.

FIG. 8 shows another possible shape of structure 24. Structure 24 has a flat top surface and flat bottom surface with a groove 26 passing through these surfaces. Groove 26 has a width sufficient to accommodate probe 10, preferably 1.1 mils. Groove 26 has a depth sufficient to allow at least 3 mils of vertical deflection of arm 20. Groove 26 can be easily machined by an excimer laser. Probe 10 is attached to structure 24 by bonding the sides of probe 10 to the vertical walls of groove 26 such that arm 20 is free to move vertically for at least 3 mils in groove 26 but constrained from moving laterally. The operation and advantages of this embodiment are the same as those disclosed for the preferred embodiment above.

Figure 9:
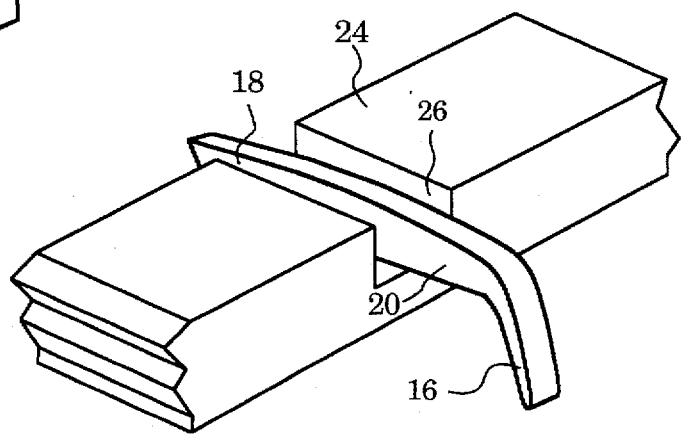
FIG. 9 is a perspective view of a probe mounted in another support structure.

FIG. 9 shows a third possible shape of structure 24. Structure 24 now has a flat top surface into which a groove 26 has been cut. Groove 26 has a width sufficient to accommodate probe 10, preferably 1.1 mils. Groove 26 can be easily machined by an excimer laser. The sides of probe 10 are attached to the vertical walls of groove 26, such that arm 20 is free to move vertically in groove 26 but constrained from moving laterally. The operation and advantages of this embodiment are the same as those disclosed for the preferred embodiment above.

Therefore, the scope of the invention should be determined, not by examples given, but by the appended claims and their legal equivalents.

SUMMARY, RAMIFICATIONS, AND SCOPE

Although the above description contains many specificities, these should not be construed as limitations on the scope of the invention, but merely as illustrations of some of the presently preferred embodiments. Many modifications to the method and device are possible in alternative embodiments. For example, membrane 12 can be composed of materials other than polyimide or ceramic. Additionally, membrane 12 may have a thickness other than 25 μm. Similarly, the preferred dimensions described for slot 14, probe 10 and groove 26 are exemplary of just one possible embodiment. Many other dimensions are possible in alternative embodiments to accommodate various testing situations.

Probe 10 may be attached to membrane 12 at other parts of probe 10 than knee section 25. For example, the attachment could be made at arm 20 or at a part of tip 16. The material 38 attaching probe 10 to membrane 12 may be something other than silicon rubber. Additionally, this material 38 may attach probe 10 to membrane 12 at locations other than just one edge or the entire perimeter of slot 14. For example, material 38 could be applied at the side edges of slot 14. Structure 24 may be made of a material other than ceramic, and may assume shapes other than those described.

We claim:

1. A device for electronic testing, the device comprising:

a) a cantilever probe having an arm, a tip, and a distal end opposite the tip;

b) a support structure for supporting the probe, the probe being attached to the support structure at the distal end;

c) a membrane for positioning the tip, the membrane being attached to the support structure and the membrane having a slot through which the tip is inserted; and d) a means for attaching the probe to the membrane such that the tip, the arm, and the membrane move from an initial position to a deflected position when an overdrive is applied to the tip and such that the tip, the arm, and the membrane return to the initial position when the overdrive is removed from the tip.

2. The device of claim 1, wherein the means for attaching the probe to the membrane comprises a silicon rubber.

3. The device of claim 1, wherein the probe has a knee section and wherein the probe is attached to the membrane at the knee section.

4. The device of claim 1, wherein the probe is attached to the membrane at an edge of the slot.

5. The device of claim 1, wherein the membrane comprises a polyimide.

6. The device of claim 1, wherein the membrane comprises a ceramic.

7. The device of claim 1, wherein the membrane has a thickness in the range of 10 to 50 μm.

8. The device of claim 1, wherein the support structure has a groove for receiving the probe and wherein the probe is mounted in the groove such that the probe is free to move vertically in the groove and constrained from moving laterally in the groove.

9. The device of claim 1, wherein the support structure has a flat top surface for supporting the probe and wherein the probe is attached to the flat top surface.

10. The device of claim 1, wherein the support structure comprises a ceramic.

11. A method for positioning a cantilever probe having an arm, a tip, and a distal end opposite the tip, the method comprising the following steps:

a) attaching a membrane to a support structure;

b) cutting in the membrane a slot for receiving the tip;

c) inserting the tip through the slot;

d) attaching the probe to the membrane; and e) attaching the distal end to the support structure.

12. The method of claim 11, wherein the probe is attached to the membrane at a knee section of the probe.

13. The method of claim 11, wherein the probe is attached to the membrane with silicon rubber.

14. The method of claim 11, wherein the probe is attached to the membrane at an edge of the slot.

15. The method of claim 11, wherein the membrane comprises a polyimide.

16. The method of claim 11, wherein the membrane comprises a ceramic.

17. The method of claim 11, wherein the membrane has a thickness in the range of 10 to 50 μm.

18. The method of claim 11, wherein the support structure has a groove for receiving the probe and wherein the step of attaching the distal end to the support structure comprises mounting the probe in the groove such that the probe is free to move vertically in the groove and constrained from moving laterally in the groove.

19. The method of claim 11, wherein the support structure has a flat top surface and wherein the distal end is attached to the flat top surface.

20. The method of claim 11, wherein the support structure comprises a ceramic.

* * * * *